US008212630B2

(12) United States Patent
Endo

(10) Patent No.: US 8,212,630 B2
(45) Date of Patent: Jul. 3, 2012

(54) THIN FILM BALUN

(75) Inventor: Makoto Endo, Tokyo (JP)

(73) Assignee: TDK Corporation, Tokyo (JP)

( * ) Notice: Subject to any disclaimer, the term of this patent is extended or adjusted under 35 U.S.C. 154(b) by 322 days.

(21) Appl. No.: 12/654,501

(22) Filed: Dec. 22, 2009

(65) Prior Publication Data

US 2010/0164644 A1 Jul. 1, 2010

(30) Foreign Application Priority Data

Dec. 26, 2008 (JP) ................................. 2008-333087

(51) Int. Cl.
*H03H 7/42* (2006.01)
*H01P 3/08* (2006.01)

(52) U.S. Cl. .......................................... 333/26; 333/246

(58) Field of Classification Search .................... 333/25, 333/26, 238, 246
See application file for complete search history.

(56) References Cited

U.S. PATENT DOCUMENTS 7,511,591 B2 * 3/2009 Ezzendine ...................... 333/26
7,692,511 B2 * 4/2010 Degani et al. ................... 333/25
7,864,014 B2 * 1/2011 Ezzeddine .................... 336/200
7,948,331 B2 * 5/2011 Endo ................................ 333/25
8,085,111 B2 * 12/2011 Endo ................................ 333/26
8,143,968 B2 * 3/2012 Endo ................................ 333/26
2010/0164643 A1 * 7/2010 Endo ................................ 333/26
2011/0012690 A1 * 1/2011 Endo ................................ 333/25

FOREIGN PATENT DOCUMENTS

JP A-2004-120291 4/2004

* cited by examiner

*Primary Examiner* — Dean O Takaoka
(74) *Attorney, Agent, or Firm* — Oliff & Berridge, PLC

(57) ABSTRACT

The present invention provides a thin film balun capable of preventing a resonant frequency from being increased to a high frequency due to size and thickness reductions and maintaining a preferable passage characteristic, while improving a balance characteristic. A thin film balun 1 includes: an unbalanced transmission line 2 having a first coil portion C1 and a second coil portion C2; and a balanced transmission line 3 having a third coil portion C3 and a fourth coil portion C4 which are magnetically coupled with the first coil portion C1 and the second coil portion C2, respectively. The first coil portion C1 is connected to an unbalanced terminal T0, and the second coil portion C2 is connected to a ground terminal G (ground potential) via a capacitor D (C component). The third coil portion C3 is connected to a balanced terminal T1 and the fourth coil portion C4 is connected to a second balanced terminal T2. At least a part of the capacitor D is contained in a second magnetic coupling area R2 formed by the coil portions C2 and C4.

4 Claims, 18 Drawing Sheets

THIN FILM BALUN

BACKGROUND

1. Field of the Invention

The present invention relates to a balun (a balun transformer) that performs conversion between unbalanced and balanced signals, and in particular relates to a thin film balun that is formed by a thin film process advantageous for size and thickness reductions.

2. Description of Related Art

A wireless communication device includes various high frequency elements such as an antenna, a filter, an RF switch, a power amplifier, an RF-IC, and a balun. Of these elements, a resonant element such as an antenna or a filter handles (transmits) an unbalanced signal which is based on a ground potential, whereas an RE-IC which generates or processes a high frequency signal handles (transmits) a balanced signal. Accordingly, when electromagnetically connecting these two elements, a balun that functions as an unbalanced-balanced converter is used.

Recently, thin film baluns that are formed by a thin film process advantageous for size and thickness reductions have been increasingly used for mobile communication devices such as mobile phones and mobile terminals, wireless LANs, etc., and in order to meet the need for further size reduction of such devices, further reductions in the sizes and thicknesses of the thin film baluns have also come to be desired. As an example of such thin film baluns, the following thin film balun has been proposed. In this related art thin film balun, a magnetic coupling is formed by an unbalanced transmission line and a balanced transmission line which are arranged so as to face each other, one end of the unbalanced transmission line is connected to an unbalanced terminal while the other end is connected to a ground terminal via a capacitor; and an output balanced terminal is connected to the balanced transmission line (see, for example, Japanese Patent Application Laid-Open No. 2004-120291).

As a passage characteristic of a thin film balun, a resonant frequency is expressed by formula (1) below.

$$fr=1/\{2\pi(L\cdot C)^{1/2}\} \quad (1),$$

In formula (1), fr represents a resonant frequency, L (L component) represents an equivalent inductance of a resonant circuit constituted from an unbalanced transmission line and a balanced transmission line, and C (C component) represents an equivalent capacitance of the resonant circuit.

In order to reduce the size and thickness of a thin film balun, the number of turns or the length of lines of coils, etc. which constitute an unbalanced transmission line and a balanced transmission line are inevitably reduced, and thus the inductance L of a resonant circuit will be lowered and the resonant frequency fr (frequency in a pass band) will be increased to a high frequency, as is obvious from formula (1). Generally, a required specification of a passage characteristic in a frequency of a thin film balun used for wireless communication, etc. (an attenuation characteristic in a predetermined frequency) is set based on the configuration, standard, specifications, etc., of a communication device or a system to be equipped with the thin film balun. For example, the peak value of the resonant frequency fr is specified to be in the range between 2400 and 2500 MHz (2.4 GHz band) as the passage characteristic. However, if the resonant frequency fr is increased to a high frequency due to the size and thickness reductions of the thin film balun, it will not be possible to satisfy such a required specification.

Meanwhile, while the resonant frequency fr can be prevented from being increased to a high frequency by increasing the capacitance C of the resonant circuit as can be seen in formula (1) above, balance characteristics of an output signal intensity and a phase (an output balance and a phase balance) are also important elements in the characteristics of a thin film baluns. Based on the inventors' knowledge, these balance characteristics will be degraded and it will become difficult to satisfy the required specification only by increasing the capacitance C.

SUMMARY

The present invention has been made in light of the above circumstances, and an object of the present invention is to provide a thin film capable of preventing a resonant frequency from being increased to a high frequency due to size and thickness reductions and maintaining a required preferable passage characteristic, while improving balance characteristics, in particular, an output balance.

In order to achieve the object above, a thin film balun according to an aspect of the present invention includes: an unbalanced transmission line having a first line portion and a second line portion; a balanced transmission line having a third line portion and a fourth line portion which are arranged so as to face the first line portion and the second line portion, respectively; an unbalanced terminal connected to the first line portion; a ground terminal connected to the second line portion via a C component (capacitance component); a first balanced terminal connected to the third line portion, and a second balanced terminal connected to the fourth line portion, wherein: the first line portion and the third line portion form a first magnetic coupling; the second line portion and the fourth line portion form a second magnetic coupling; and at least a part of the C component is contained in an area which is on a side of the second magnetic coupling with respect to a boundary between the first magnetic coupling and the second magnetic coupling (i.e., of the area of the first magnetic coupling and area of the second magnetic coupling, the one which contains the ground terminal). Note that the "ground terminal" is synonymous with the "ground potential."

With such a configuration, the C component connected to the second line portion that is included in the unbalanced transmission line introduces a capacitance C in a resonant circuit of the thin film balun, thereby suppressing an increase in a resonant frequency. The inventors, after devoting themselves to research, found that when the C component is provided so as to be contained in the area of the first magnetic coupling formed by: the first line portion, which is not connected to the ground terminal, in the unbalanced transmission line; and the third line portion, which is arranged so as to face the first line portion, in the balanced transmission line, it would become difficult to adjust both the passage characteristic and the balance characteristics (in particular, the output balance) to be within desired ranges (specifications), while when at least a part of the C component is provided on the side of (extended to) the second magnetic coupling formed by: the second line portion, which is connected to the ground terminal, in the unbalanced transmission line; and the fourth line portion, which is arranged so as to face the second line portion, in the balanced transmission line, both of the above characteristics would be able to be effectively improved, although the effect and the mechanism are not known in detail.

It is more preferable to arrange at least a part of the C component within the area of the second magnetic coupling in a planar direction.

Specifically, the configuration in which the first to fourth line portions are primarily constituted from respective coil portions can be provided as an example, and such a configuration can provide effects similar to those described above.

In other words, the thin film balun according to another aspect of the present invention may include an unbalanced transmission line having a first coil portion and a second coil portion; a balanced transmission line having a third coil portion and a fourth coil portion which are arranged so as to face the first coil portion and the second coil portion, respectively; an unbalanced terminal connected to the first coil portion; a ground terminal connected to the second coil portion via a C component; a first balanced terminal connected to the third coil portion; and a second balanced terminal connected to the fourth coil portion, wherein: the first coil portion and the third coil portion form a first magnetic coupling; the second coil portion and the fourth coil portion form a second magnetic coupling; and at least a part of the C component (capacitance component) is contained in an area which is on a side of the second magnetic coupling with respect to a boundary between the first magnetic coupling and the second magnetic coupling (i.e., of the area of the first magnetic coupling and the area of the second magnetic coupling, the one which contains the ground terminal).

In such a configuration, a capacitor which has: a first electrode connected to the second coil portion; and a second electrode arranged so as to face the first electrode via a dielectric layer and connected to the ground terminal electrode, as well as a configuration including such a capacitor, may be provided as examples of the C component.

It is preferable to arrange at least a part of the capacitor within the area of the second coil portion and/or the area of the fourth coil portion (i.e., within the area of the second magnetic coupling) in the planar direction, since the output balance can further be improved and the area to mount the thin film balun can be prevented from being enlarged, and it is more preferable to arrange at least a part of the capacitor within the area facing a coil opening of the second coil portion and/or a coil opening of the fourth coil portion (the area of the second magnetic coupling) in the planar direction (i.e., to arrange at least a part of the capacitor at a position overlapping a substantially central area of the coil portion in the planar direction), since the output balance can be further improved.

In the present invention, since at least a part of the C component (capacitor) connected to the ground terminal is contained in the area which is on the side of the second magnetic coupling with respect to the boundary between the first magnetic coupling formed by the first line portion (first coil portion) and the third line portion (third coil portion) and the second magnetic coupling formed by the second line portion (second coil portion) and the fourth line portion (fourth coil portion), a resonant frequency can be effectively prevented from being increased to a high frequency due to size and thickness reductions of a thin film balun and thus a preferable passage characteristic can be achieved, and in addition, the balance characteristics (in particular, the output balance) can also be improved.

DETAILED DESCRIPTION OF PREFERRED EMBODIMENTS

Figure 1:
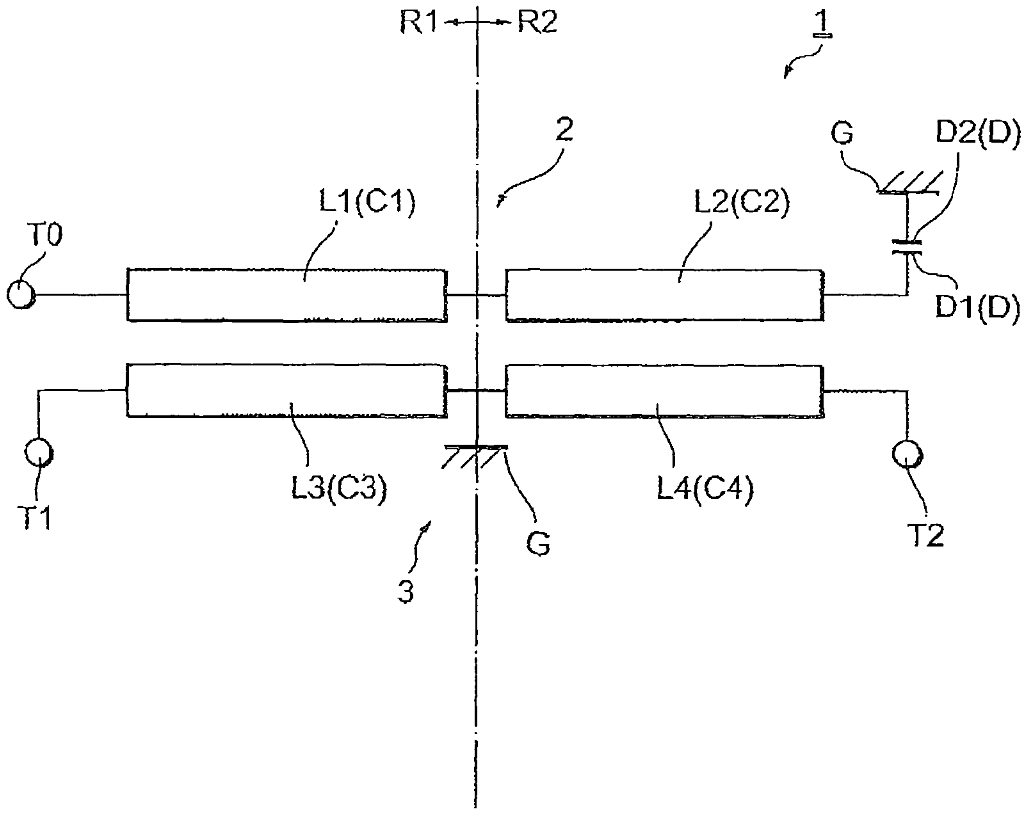
FIG. 1 is an equivalent circuit diagram showing a configuration of a preferred embodiment according to a thin film balun in the present invention.

An embodiment of the present invention will be described below with reference to the attached drawings. Note that the same components in the drawings are given the same reference numerals, and repeated descriptions are omitted. The positional relationships such as the top, bottom, left, and right are based on the positional relationships shown in the drawings, unless otherwise specified. Furthermore, scale ratios of the drawings are not limited to the illustrated ratios. Note also that the following embodiments are merely examples for describing the present invention, and that the present invention is not limited only to the embodiments. Various modifications may be made to the present invention without departing from the scope of the present invention.

FIG. 1 is an equivalent circuit diagram showing a configuration of a preferred embodiment according to a thin film balun in the present invention. A thin film balun 1 includes: an unbalanced transmission line 2 in which a line portion L1 (first line portion) and a line portion L2 (second line portion) are connected in series; and a balanced transmission line 3 in which a line portion L3 (third line portion) and a line portion L4 (fourth line portion) are connected in series, where a magnetic coupling is formed between the line portion L1 and the line portion L3 and between the line portion L2 and the line portion L4. Note that, the former forms a first magnetic coupling and the latter forms a second magnetic coupling, though an area where two magnetic coupling components cannot be clearly distinguished from each other may exist in some configurations. In the drawings of this specification, for convenience of explanation, the left side with respect to the alternate long and short dash line is indicated as a first magnetic coupling area R1 and the right side is indicated as a second magnetic coupling area R2. In this arrangement, the alternated long and short dash line indicates the boundary between the first magnetic coupling and the second magnetic coupling.

In the thin film balun 1, an end of the line portion L1, the end being the other end of a coupling end with the line portion L2, is connected to an unbalanced terminal T0, while an end of the line portion L2, the end being the other end of a coupling end with the line portion L1, is connected to a ground terminal G (ground potential) via a capacitor D (C component (capacitance component)). That is, the ground terminal G is provided on the side of the second magnetic coupling area R2. In other words, of the two magnetic coupling areas, the one which is close to the ground terminal G is the second magnetic coupling area R2, and the one which is distant from the ground terminal G is the first magnetic coupling area R1. In the capacitor D, an electrode D1 (first electrode) connected to the other end of the line portion L2 and an electrode D2 (second electrode) connected to the ground terminal G are arranged so as to face each other via a suitable dielectric body. Ends of the line portion L3 and line portion L4, the ends being the other ends of respective coupling ends, are connected respectively to a balanced terminal T1 (first balanced terminal) and a balanced terminal T2 (second balanced terminal). A coupled portion between the line portion L3 and line portion L4 is grounded to the same potential as the ground terminal G.

The lengths of the line portions L1 to L4 above change depending on specifications of the thin film balun 1, and the lengths may be selected so as to form, for example, a quarter-wavelength (λ/4) resonator circuit of a transmission signal which is subject to conversion. The shapes of the line portions L1 to L4 can be arbitrarily selected as long as the above magnetic couplings can be formed, examples of which may include a spiral shape (coil shape), a zigzag shape, a straight line, and a curved line.

A basic operation of the thin film balun 1 will be described below, with reference to FIG. 1. In the thin film balun 1 described above, when an unbalanced signal is input in the unbalanced terminal T0, the unbalanced signal propagates through the line portion L1 and the line portion L2. Due to the magnetic coupling between the line portion L1 and the line portion L3 (first magnetic coupling) and the magnetic coupling between the line portion L2 and the line portion L4 (second magnetic coupling), the input unbalanced signal is converted to two balanced signals whose phases are different by 180° (π), and the two balanced signals are output respectively from the balanced terminal T1 and the balanced terminal T2. A converting operation from balanced signals to an unbalanced signal is made in the reverse manner of the converting operation from the unbalanced signal to the balanced signals described above.

The following description describes an embodiment of the thin film balun 1 which uses, as line portions L1 to L4, coil portions constituted from coil conductors.

Embodiment 1

Figure 2:
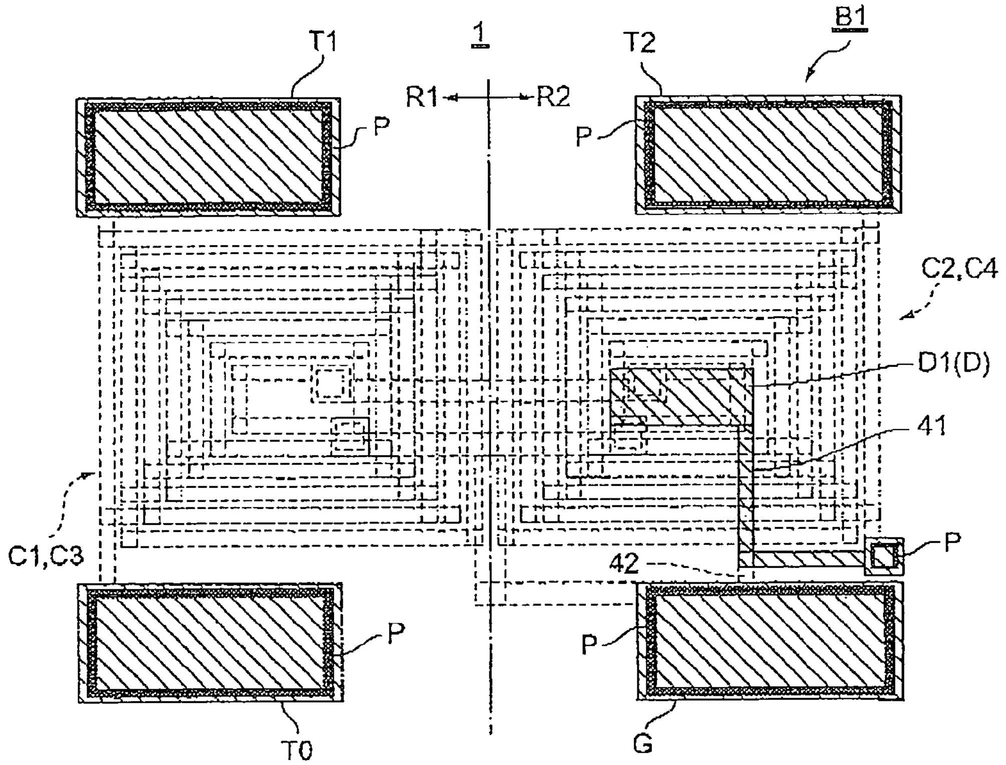
FIG. 2 is a horizontal sectional view showing a wiring layer B1 of a thin film balun 1.
Figure 3:
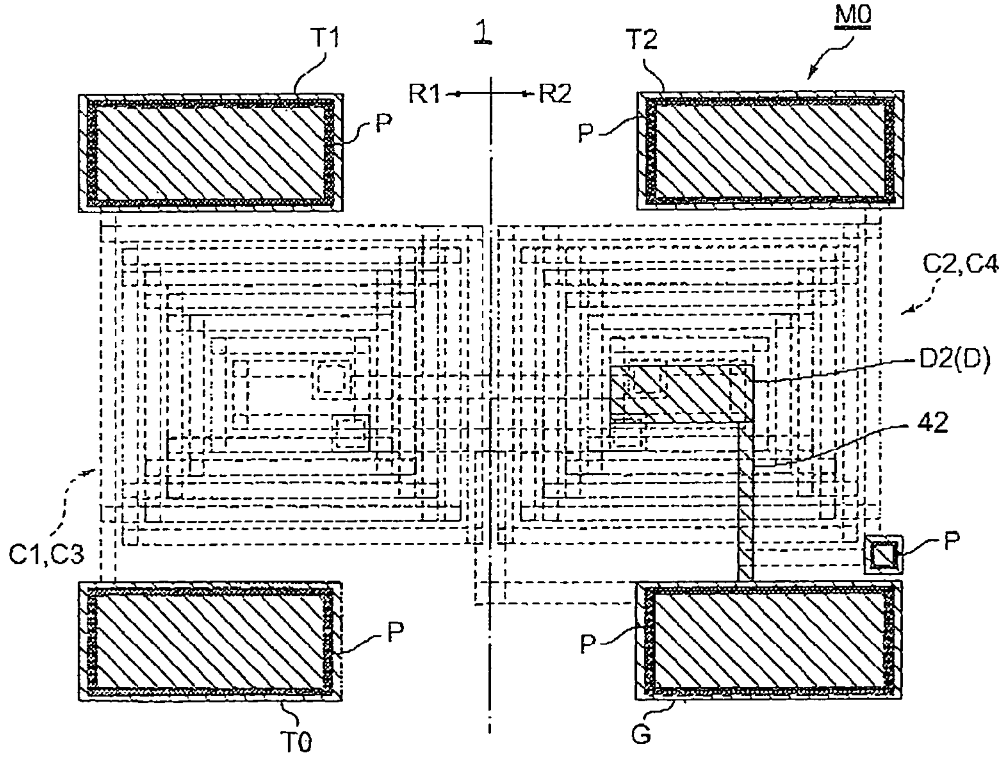
FIG. 3 is a horizontal sectional view showing a wiring layer M0 of the thin film balun 1.
Figure 4:
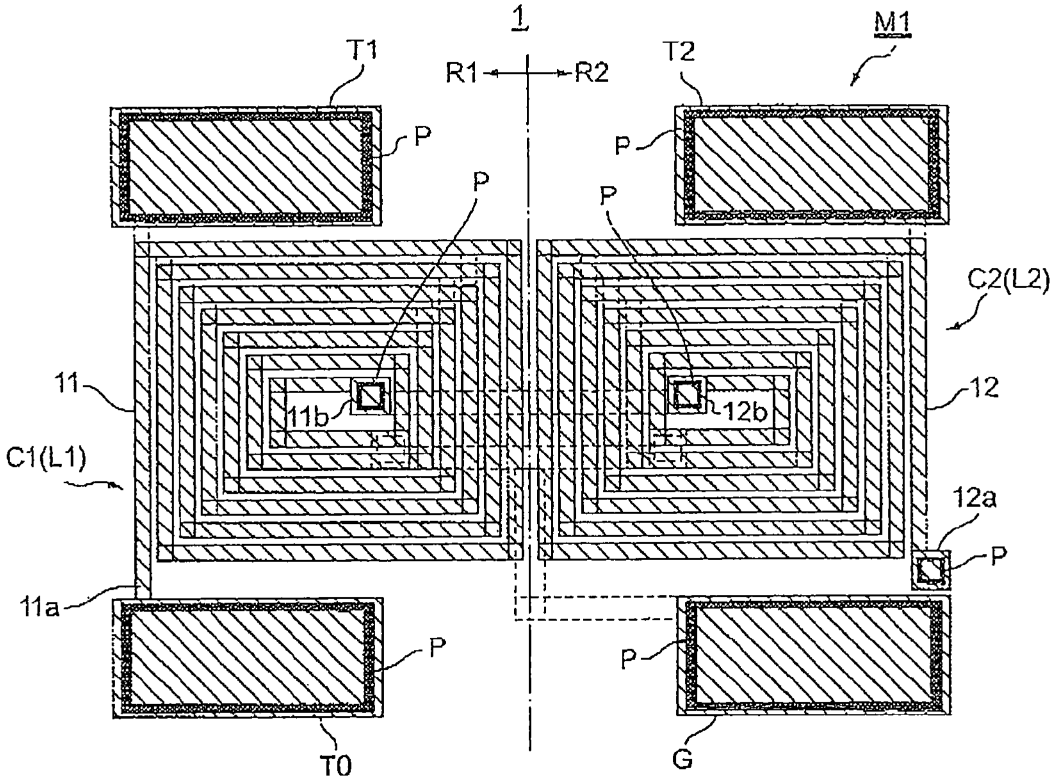
FIG. 4 is a horizontal sectional view showing a wiring layer M1 of the thin film balun 1.
Figure 5:
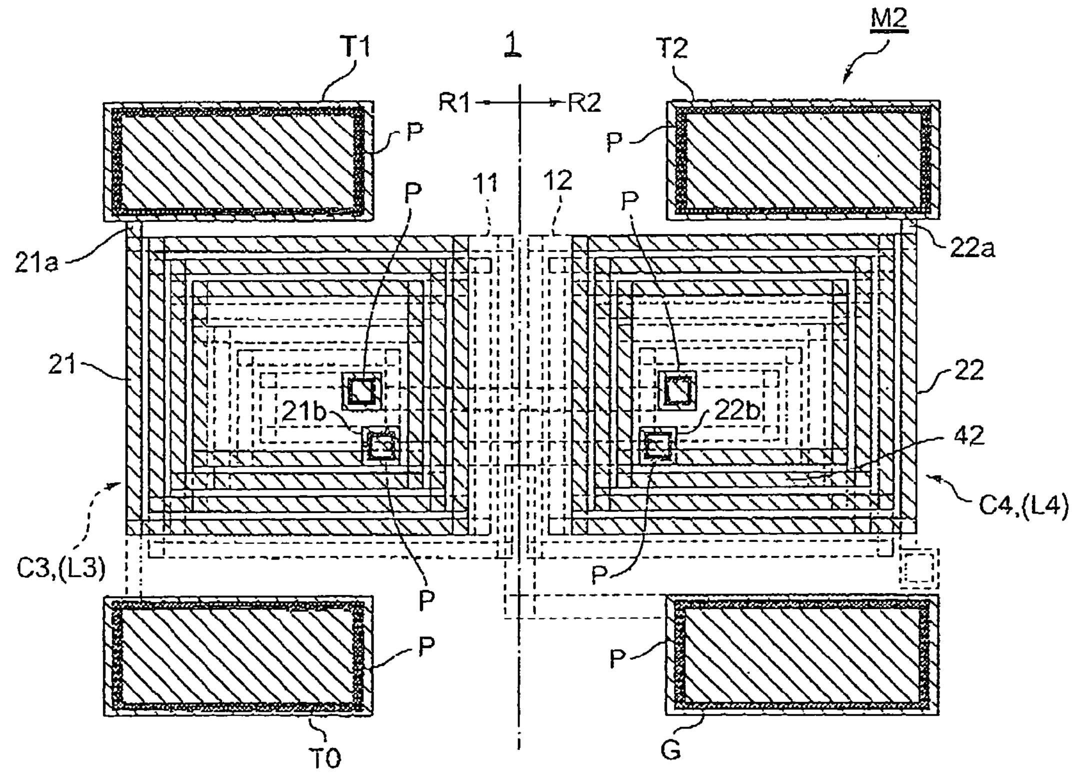
FIG. 5 is a horizontal sectional view showing a wiring layer M2 of the thin film balun 1.
Figure 6:
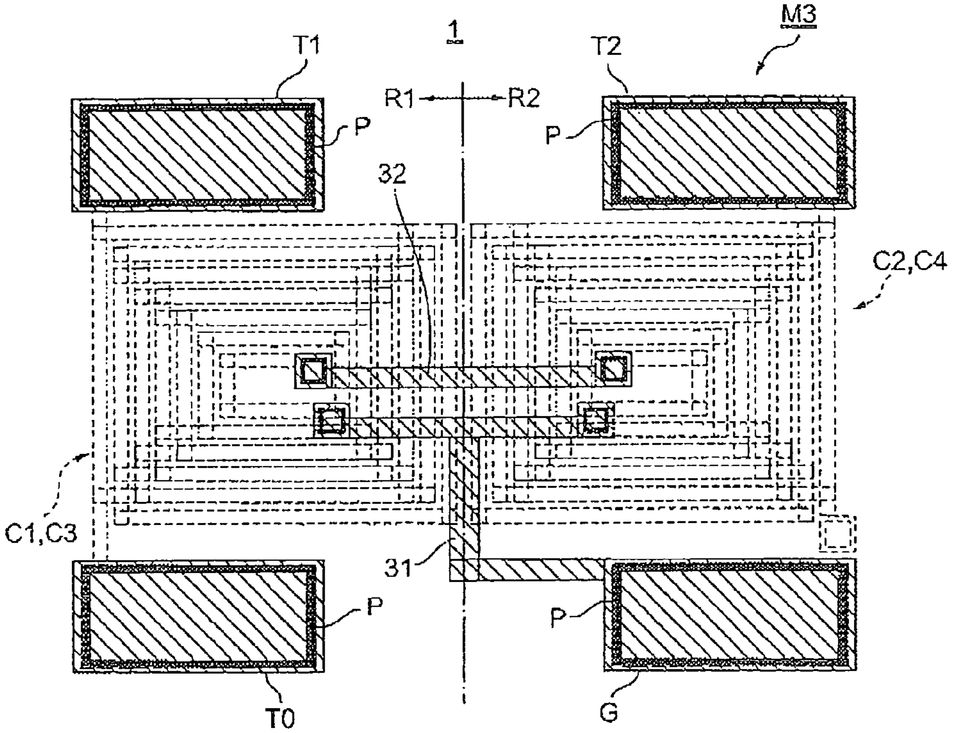
FIG. 6 is a horizontal sectional view showing a wiring layer M3 of the thin film balun 1.
Figure 7:
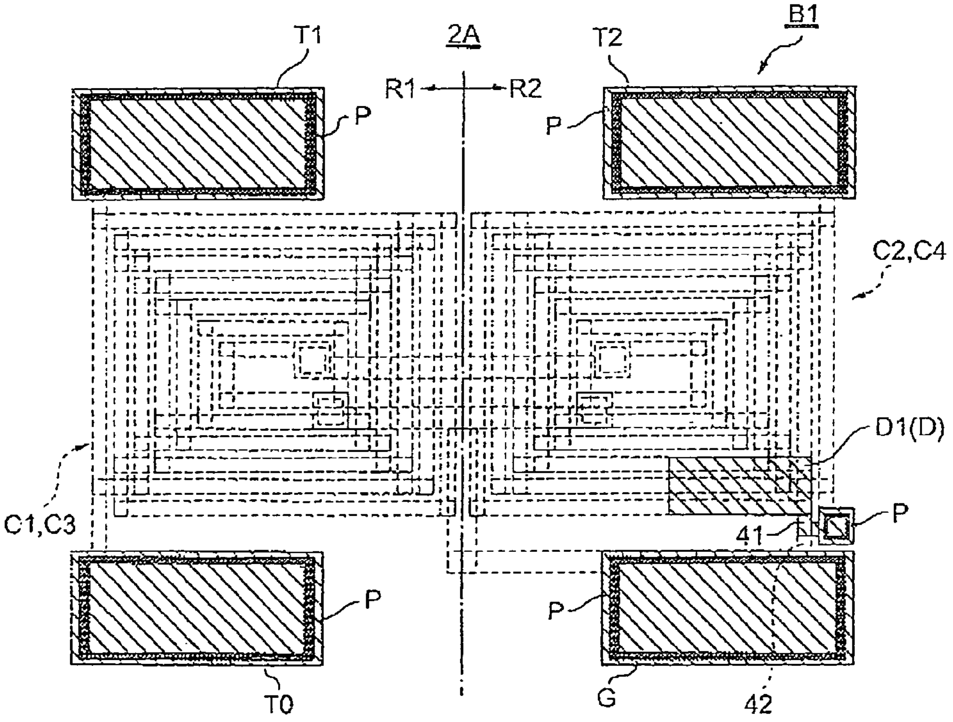
FIG. 7 is a horizontal sectional view showing a wiring layer B1 of a thin film balun 2A.
Figure 8:
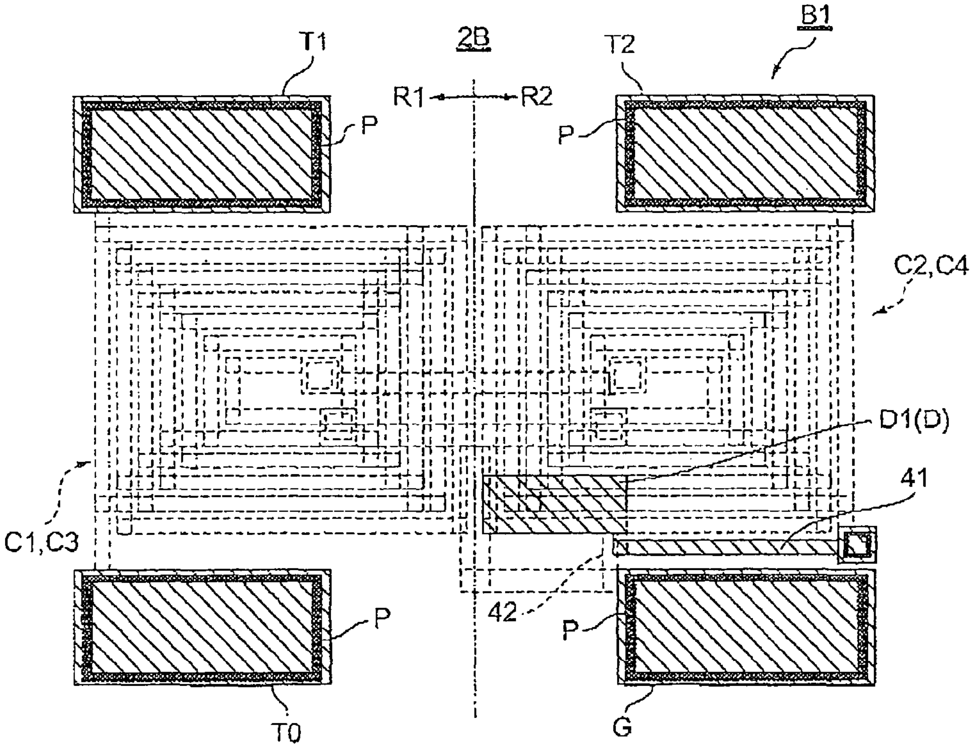
FIG. 8 is a horizontal sectional view showing a wiring layer B1 of a thin film balun 2B.
Figure 9:
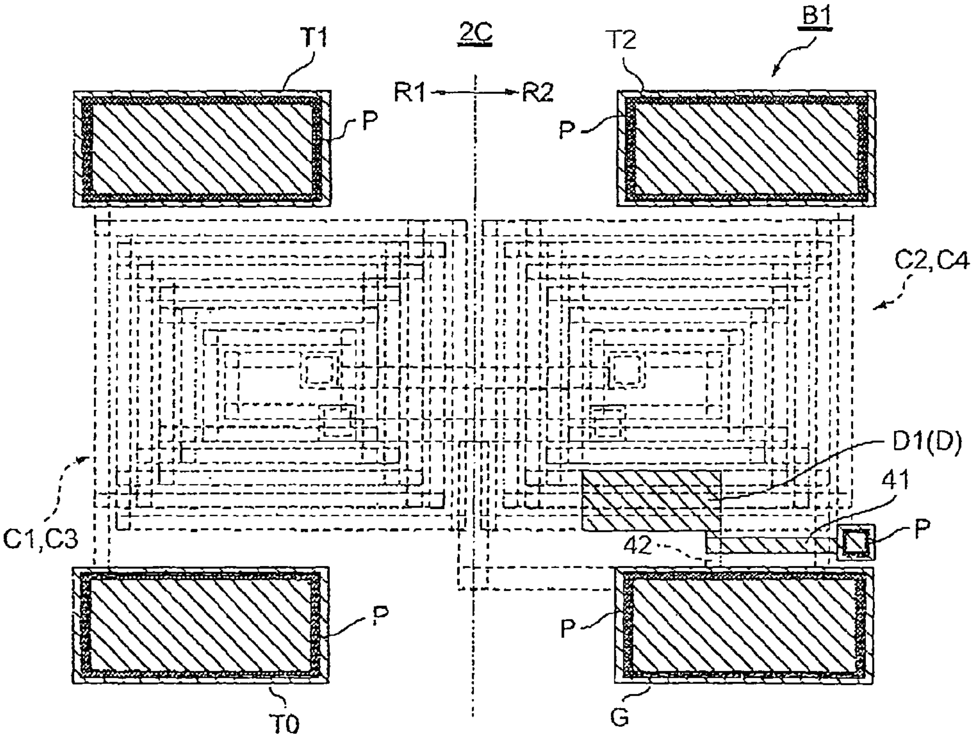
FIG. 9 is a horizontal sectional view showing a wiring layer B1 of a thin film balun 2C.
Figure 10:
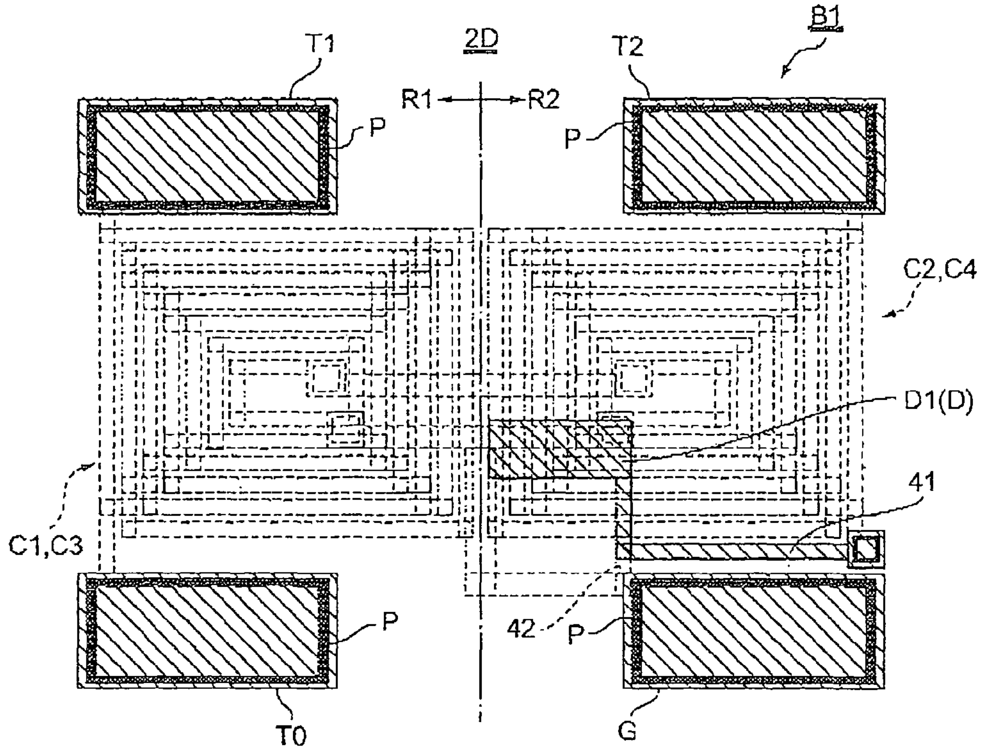
FIG. 10 is a horizontal sectional view showing a wiring layer B1 of a thin film balun 2D.
Figure 11:
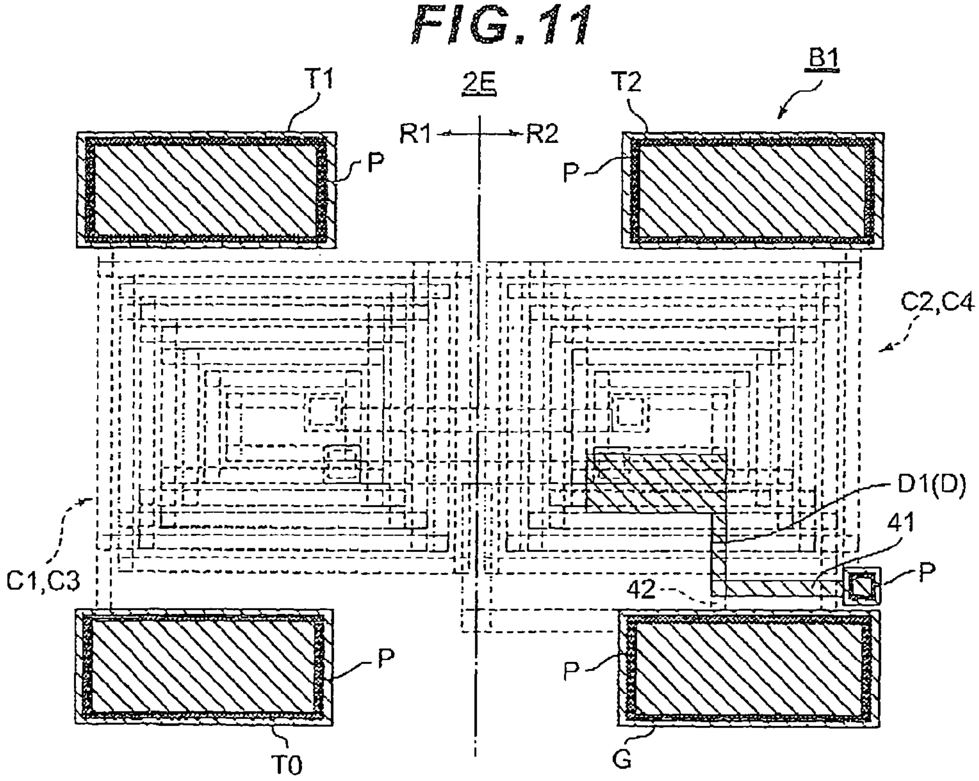
FIG. 11 is a horizontal sectional view showing a wiring layer B1 of a thin film balun 2E.
Figure 12:
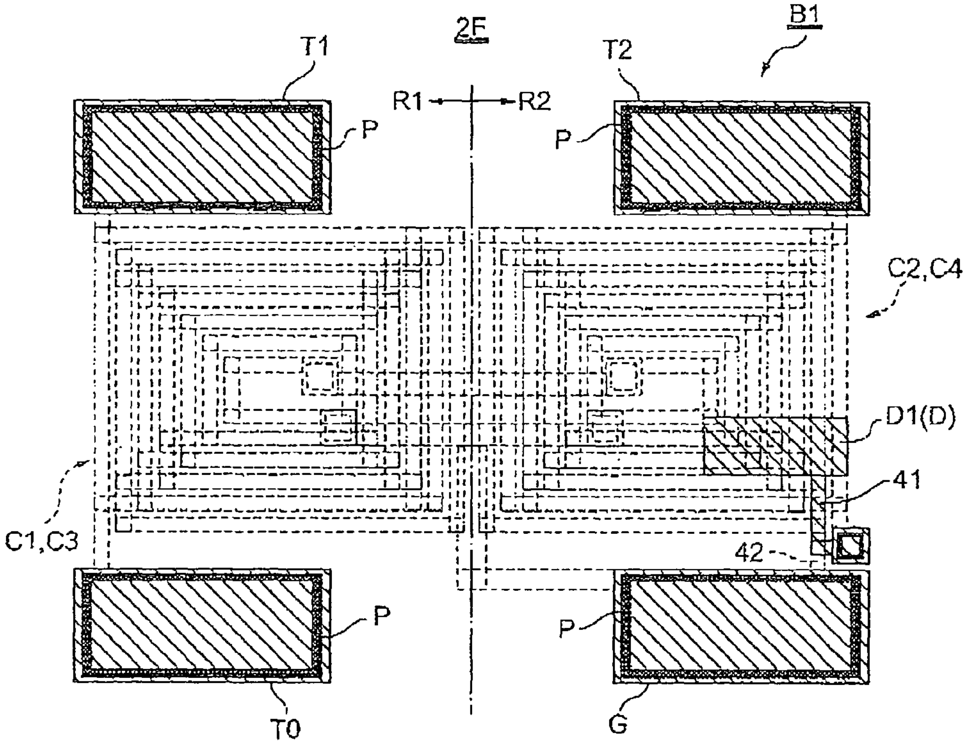
FIG. 12 is a horizontal sectional view showing a wiring layer B1 of a thin film balun 2F.
Figure 13:
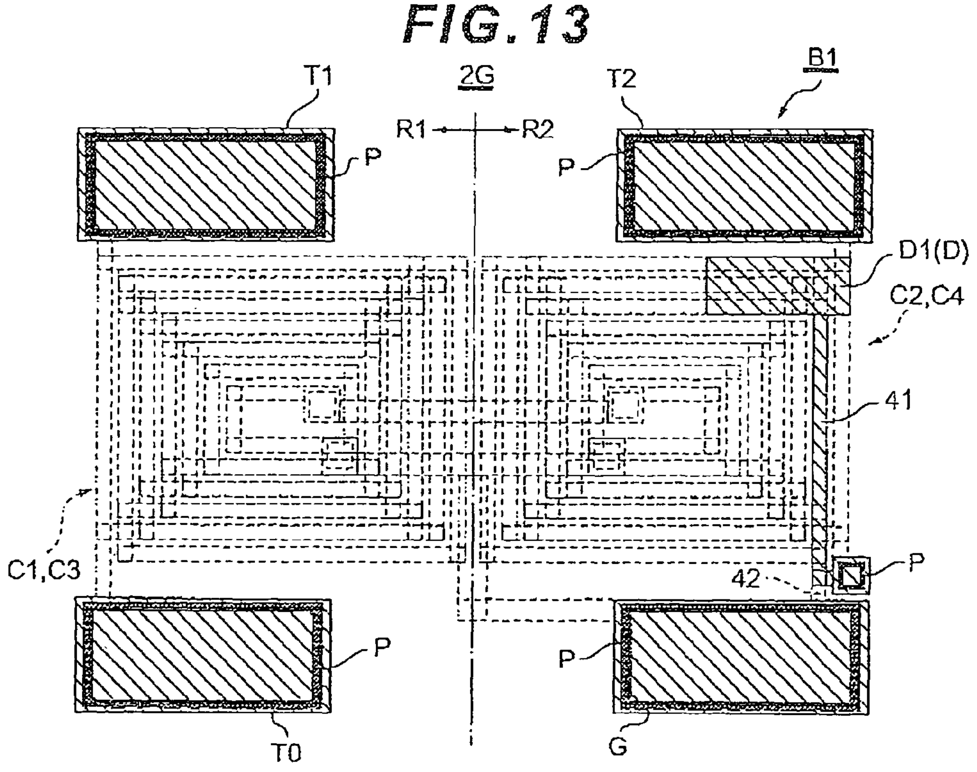
FIG. 13 is a horizontal sectional view showing a wiring layer B1 of a thin film balun 2G.

FIGS. 2 to 6 are horizontal sectional views schematically showing each wiring layer of the thin film balun 1 in embodiment 1. Specifically, FIG. 2 shows a horizontal cross section at a wiring layer B1 which is formed on an insulating substrate made of, for example, alumina. FIG. 3 shows a horizontal cross section at a wiring layer M0 formed in an insulating layer made of, for example, a polyimide (the same applies to insulating layers mentioned below) via a dielectric layer made of, for example, SiN. FIGS. 4 to 6 show respective horizontal cross sections at wiring layers M1, M2 and M3 which are sequentially formed above the wiring layer M0 respectively via insulating layers. As described above, the thin film balun 1 is constituted from thin film multiple wiring layers which are formed on the insulating substrate.

As shown in FIGS. 2 to 6, the unbalanced terminal T0, the balanced terminals T1 and T2, and the ground terminal G are formed on all of the wiring layers B1 and M0 to M3. Each of the terminals T0 to T2 and G is electrically connected between different layers via through holes P. Note that all through holes P shown in FIGS. 2 to 6 are electroplated for providing electrical conduction between upper and lower layers. The structure of each wiring layer will be described in detail below.

As shown in FIG. 2, on the wiring layer B1 which is formed on the substrate, the electrode D1 of the capacitor D is formed in an area facing coil openings of coil portions C2 and C4 (described later) provided in the second magnetic coupling area, and the electrode D1 is connected to a through hole P provided in the vicinity of the ground terminal G by a wire 41. As shown in FIG. 3, the electrode D2 (having the same shape as the electrode D1 in this example) of the capacitor D is formed on the wiring layer M0 above the wiring layer B1, at a position facing the electrode D1 on the wiring layer B1, the electrode D2 connected to the ground terminal G by a wire 42.

As shown in FIG. 4, a coil portion C1 (first coil portion, first line portion) and a coil portion C2 (second coil portion, second line portion) which constitute the unbalanced transmission line 2 are formed adjacent to each other on the wiring layer M1. Each of the coil portions C1 and C2 forms an equivalent of a quarter-wavelength (λ/4) resonator. An outer end 11*a* of a coil conductor 11 constituting the coil portion C1 is connected to the unbalanced terminal T0, and an inner end 11*b* of the coil conductor 11 is connected to a through hole P. An inner end 12*b* of a coil conductor 12 constituting the coil portion C2 is connected to a through hole P, and an outer end 12*a* of the coil conductor 12 is connected to the electrode D1 of the above-mentioned capacitor D via the through hole P.

As shown in FIG. 5, a coil portion C3 (third coil portion, third line portion) and a coil portion C4 (fourth coil portion, fourth line portion) which constitute the balanced transmission line 3 are formed adjacent to each other on the wiring layer M2. Each of the coil portions C3 and C4 forms an equivalent of a quarter-wavelength (λ/4) resonator, in the same way as the coil portions C1 and C2. The coil portions C3 and C4 of the balanced transmission line 3 are arranged so as to face the coil portions C1 and C2 of the unbalanced transmission line 2, respectively, and the facing portions are magnetically coupled to form couplers. An outer end 21*a* of a coil conductor 21 constituting the coil portion C3 is connected to the balanced terminal T1, and an inner end 21*b* of the coil conductor 21 is connected to a through hole P. An outer end 22*a* of a coil conductor 22 constituting the coil portion C4 is connected to the balanced terminal T2, and an inner end 22*b* of the coil conductor 22 is connected to a through hole P.

As shown in FIG. 6, a wire 31 for connecting the coil portion C3 and the coil portion G4 to the ground terminal G, and a wire 32 for connecting the coil portion C1 and the coil portion C2 to each other are formed on the wiring layer M3. The wire 31 is a branch wire formed so as to connect the two through holes P to the ground terminal G. The wire 31 is connected to the end 21*b* of the coil conductor 21 and the end 22*b* of the coil conductor 22 formed on the wiring layer M2 via the two through holes P. On the other hand, the wire 32 is connected to the end 11*b* of the coil conductor 11 and the end 12*b* of the coil conductor 12 formed, on the wiring layer M1 via the through holes P As described above, in this embodiment, the thin film balun 1 constituting the equivalent circuit shown in FIG. 1 can be realized by a multilayer wiring structure in which: the two coil portions C1 and C2 that constitute the unbalanced transmission line are formed on one layer (wiring layer M1); the two coil portions C3 and C4 that constitute the balanced transmission line are formed on another layer (wiring layer M2) that is adjacent to the wiring layer M1; the wire 32 for connecting the coil portions C1 and C2 to each other and the wire 31 for connecting the coil portions C3 and C4 to each other are formed on another layer (wiring layer M3) that is adjacent to the wiring layer M2 on the opposite side to the wiring layer M1; and the capacitor having the electrodes D1 and D2 are formed on each of the layers (wiring layers B1 and M0) that are adjacent to the wiring layer M1 on the opposite side to the wiring layer M2. Note that the capacitor D having the electrodes D1 and D2 may be formed on a layer above the wiring layer M3 or may be formed between the wiring layer M0 and the wiring layer M1, instead of being formed on the wiring layer B1 formed immediately above the substrate and the wiring layer M0 formed above the wiring layer B1.

Embodiments 2A to 2G

FIGS. 7 to 13 are horizontal sectional views schematically showing wiring layers B1 in thin film baluns 2A to 2G in embodiments 2A to 2G according to the present invention. As shown in each figure, in the thin film baluns 2A to 2G, the capacitor D is arranged, in a plan view, within the area of the coil portions C2 and C4 (i.e., within the area of the second magnetic coupling) in the second magnetic coupling area R2 which includes the second magnetic coupling formed by the coil portions C2 and C4. Note that, although only the electrode D1 of the capacitor D is shown in each of the figures, the electrode D2 having the same shape as that of the electrode D1 is formed at a position facing the electrode D1 in the wiring layer M0.

Embodiments 3A to 3C

Figure 14:
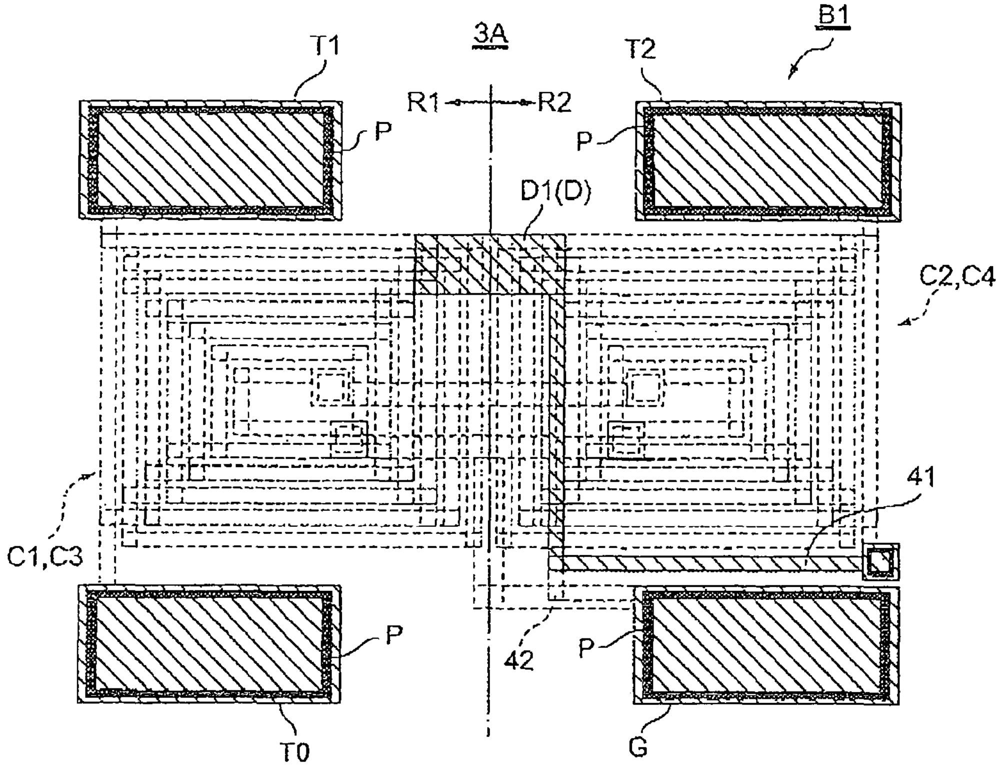
FIG. 14 is a horizontal sectional view showing a wiring layer B1 of a thin film balun 3A.
Figure 15:
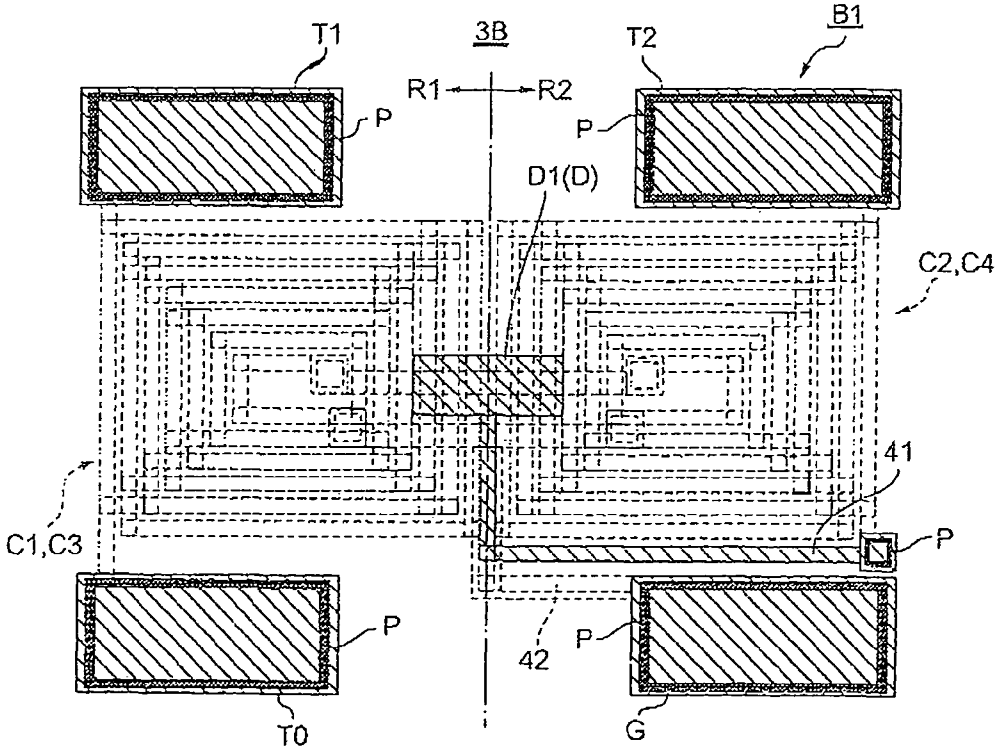
FIG. 15 is a horizontal sectional view showing a wiring layer B1 of a thin film balun 3B.
Figure 16:
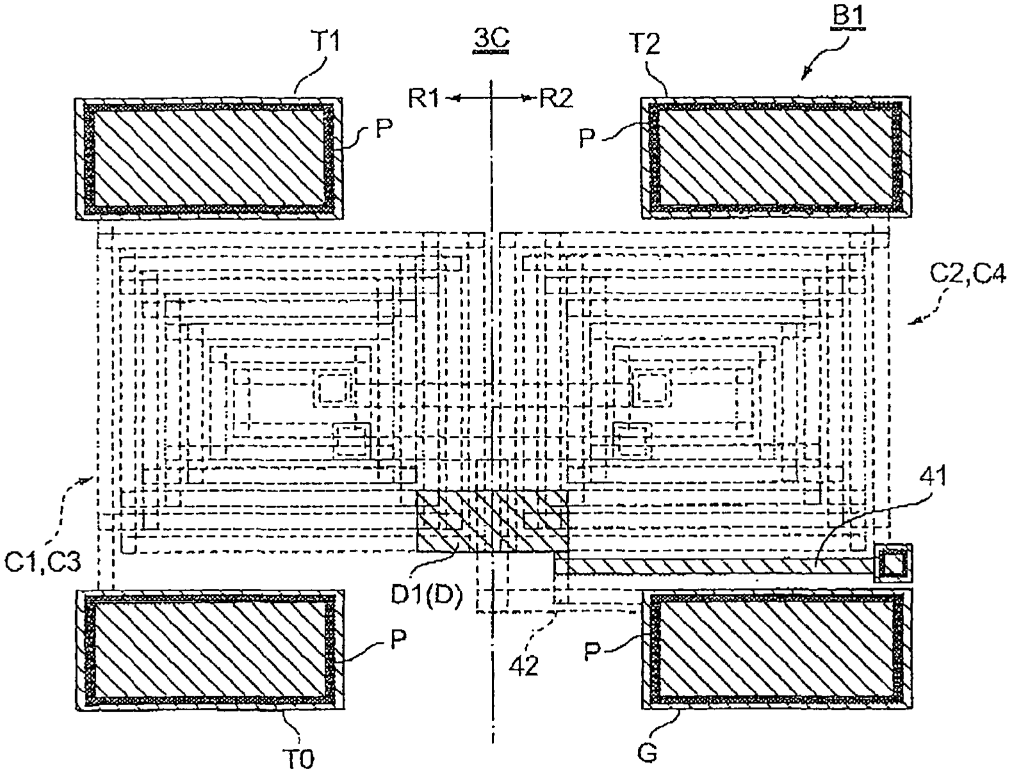
FIG. 16 is a horizontal sectional view showing a wiring layer B1 of a thin film balun 3C.

FIGS. 14 to 16 are horizontal sectional views schematically showing wiring layers B1 in thin film baluns 3A to 3C in embodiments 3A to 3C according to the present invention. As shown in each figure, in the thin film baluns 3A to 3C, a part of the capacitor D is arranged, in a plan view, within the area of the coil portions C2 and C4 (i.e., within the area of the second magnetic coupling) in the second magnetic coupling area R2 which includes the second magnetic coupling formed by the coil portions C2 and C4. Note that, although only the electrode D1 of the capacitor D is shown in each of the figures, the electrode D2 having the same shape as that of the electrode D1 is formed at a position facing the electrode D1 in the wiring layer M0.

Embodiment 4

Figure 17:
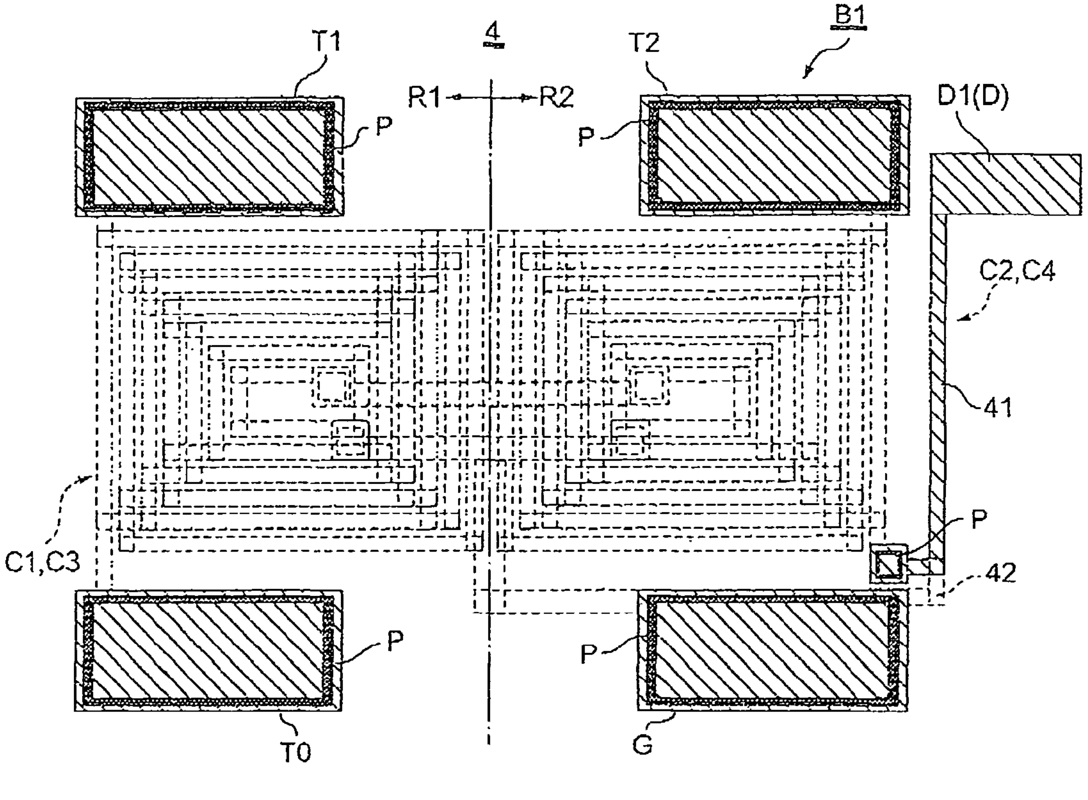
FIG. 17 is a horizontal sectional view showing a wiring layer B1 of a thin film balun 4.

FIG. 17 is a horizontal sectional view schematically showing a wiring layer B1 in a thin film balun 4 in embodiment 4 according to the present invention. As shown in FIG. 17, in the thin film balun 4, the capacitor D is arranged, in a plan view, in the second magnetic coupling area R2 which includes the second magnetic coupling formed by the coil portions C2 and C4, and at a position outside the area of the coil portions C2 and C4 (i.e., outside the area of the second magnetic coupling). Note that, although only the electrode D1 of the capacitor D is shown in FIG. 17, the electrode D2 having the same shape as that of the electrode D1 is formed at a position facing the electrode D1 in the wiring layer M0.

Comparative Example

Figure 18:
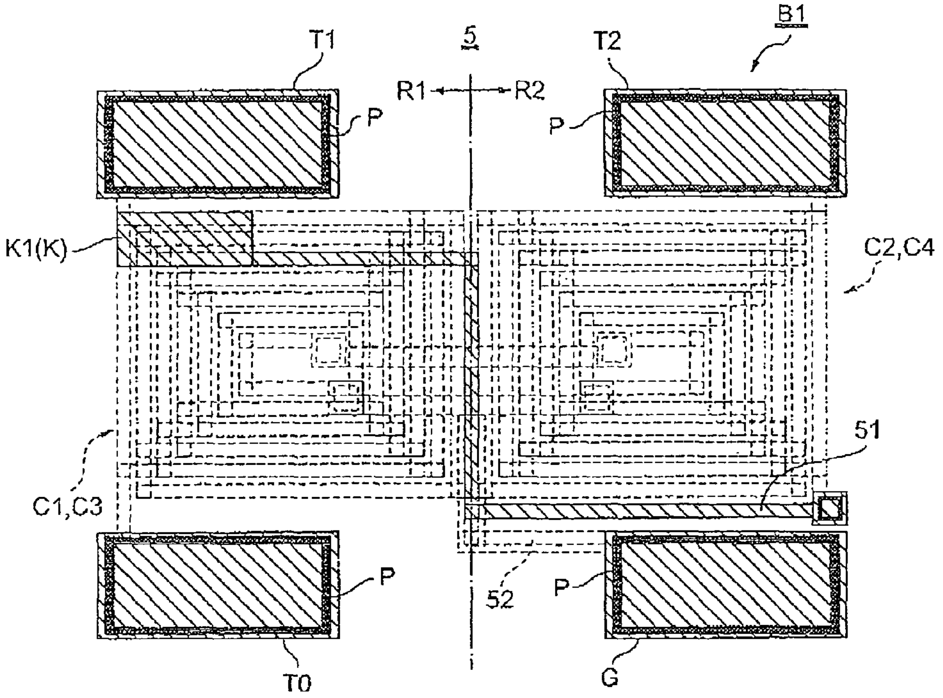
FIG. 18 is a horizontal sectional view showing a wiring layer B1 of a thin film balun 5 (comparative example).
Figure 19:
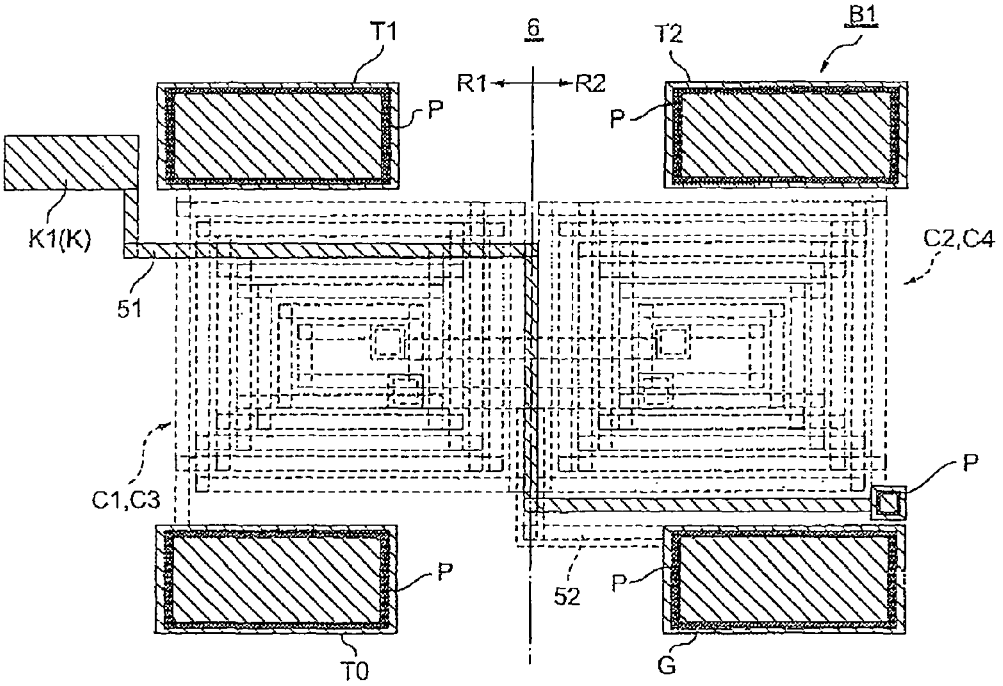
FIG. 19 is a horizontal sectional view showing a wiring layer B1 of a thin film balun 6 (comparative example).
Figure 20:
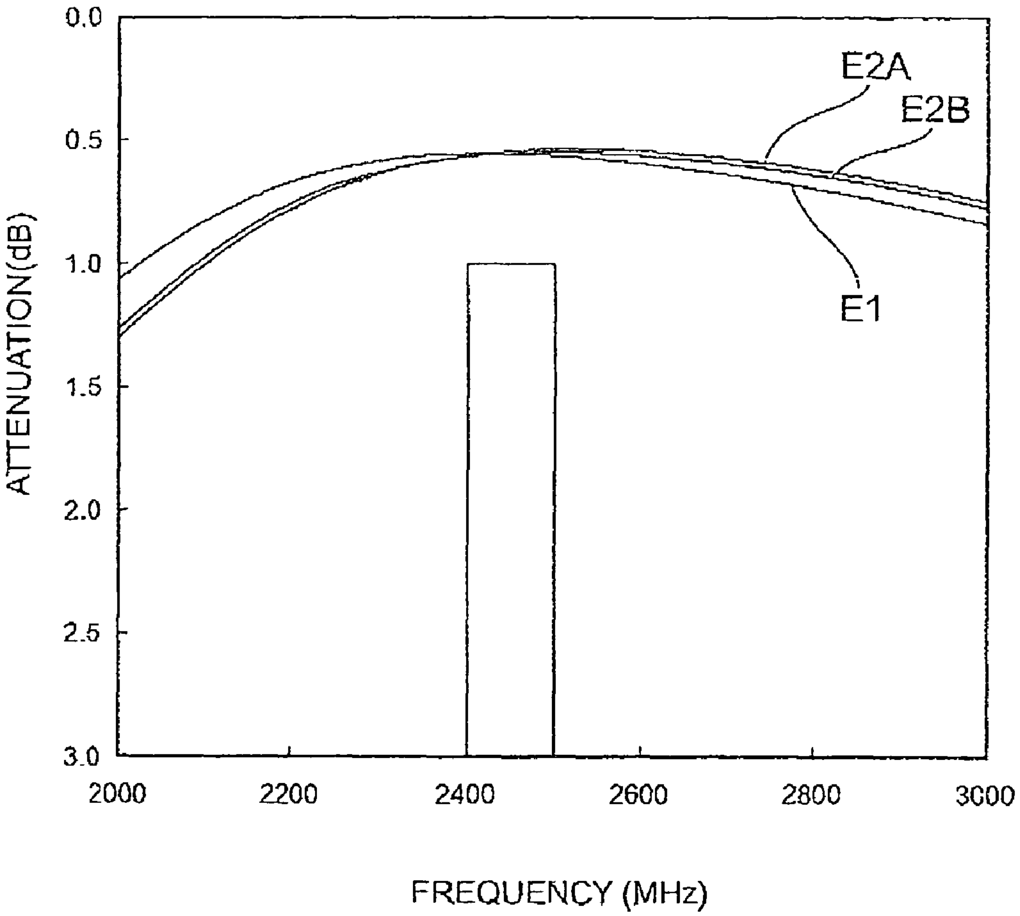
FIG. 20 is a graph showing the evaluation results of a passage characteristic.
Figure 21:
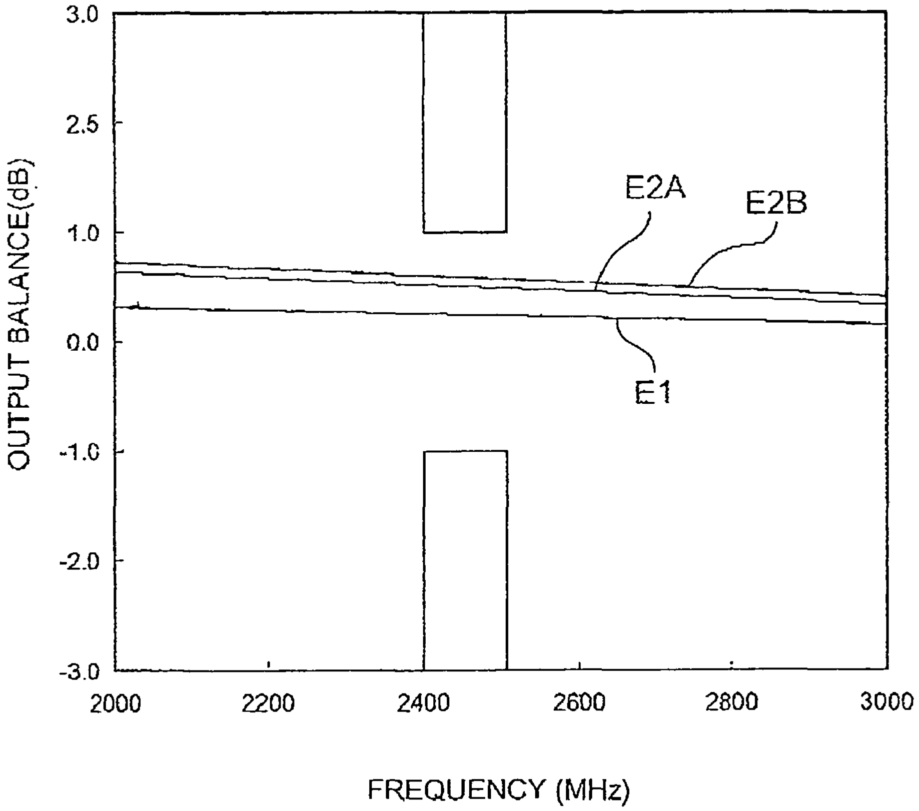
FIG. 21 is a graph showing the evaluation results of a balance characteristic.

FIGS. 18 and 19 are horizontal sectional views schematically showing wiring layers B1 in thin film baluns 5 and 6 according to comparative examples.

As shown in FIG. 18, in the thin film balun 5 of the comparative example, a capacitor K is arranged, in a plan view, within the area of the coil portions C1 and C3 (i.e., within the area of the first magnetic coupling) in the first magnetic coupling area R1 which includes the first magnetic coupling formed by the coil portions C1 and C3. Note that, although only an electrode K1 of the capacitor K is shown in FIG. 18, a counter electrode (corresponding to the electrode D2 in the embodiments of the present invention) having the same shape as that of the electrode K1 is formed at a position facing the electrode K1 in the wiring layer M0. The electrode K1 is connected to a through hole P in the vicinity of the ground terminal G by a wire 51, and the counter electrode is connected to the ground terminal G by a wire 52.

As shown in FIG. 19, in the thin film balun 6 of the comparative example, a capacitor K is arranged, in a plan view, in the first magnetic coupling area R1 which includes the first magnetic coupling formed by the coil portions C1 and C3, and at a position outside the area of the coil portions C1 and C3 (i.e., outside the area of the first magnetic coupling). Note that, although only an electrode K1 of the capacitor K is shown in FIG. 19, a counter electrode (corresponding to the electrode D2 in the embodiments of the present invention) having the same shape as that of the electrode K1 is formed at a position facing the electrode K1 in the wiring layer M0, in the same way as the thin film balun 5. The electrode K1 is connected to a through hole P in the vicinity of the ground terminal G by a wire 51, and the counter electrode is connected to the ground terminal G by a wire 52.

(Evaluation of Characteristics)

A passage characteristic (attenuation characteristic) for a transmission signal and an output balance as a balance characteristic in each of the above-described thin film baluns 1, 2A to 2G, 3A to 3C and 4 in each embodiment and the above-described thin film baluns 5 and 6 in the comparative examples were evaluated through simulation, and the evaluation results are shown in FIGS. 20 to 27.

Of these figures, FIGS. 20, 22, 24 and 26 are graphs showing the evaluation results of passage characteristics, while FIGS. 21, 23, 25 and 27 are graphs showing the evaluation results of balance characteristics. The transmission characteristic of each thin film balun was evaluated through the simulation where an evaluation target frequency (resonant frequency fr) of the transmission signal was set to the range between 2400 and 2500 MHz, a targeted specification of attenuation in this frequency range was set to below 1 dB, and a targeted specification of an output balance in this frequency range was set to +/−1.0 dB.

In each figure, the curved lines E1, E2A to E2G, E3A to E3C and E4 show the evaluation results of the thin film baluns 1, 2A to 2G, 3A to 3C and 4, respectively, and the curved lines R5 and R6 show the evaluation result of the thin film baluns 5 and 6, respectively. These results indicate that the thin film balun in each embodiment had a suitable passage characteristic and balance characteristic (output balance) which satisfied the targeted specifications. Focusing on the balance characteristic, the thin film balun 1 exhibited the best balance, which was followed by the thin film baluns 2A to 2G and 4 exhibiting similarly good balance, which was followed by the thin film baluns 3A to 3C exhibiting good balance.

Figure 22:
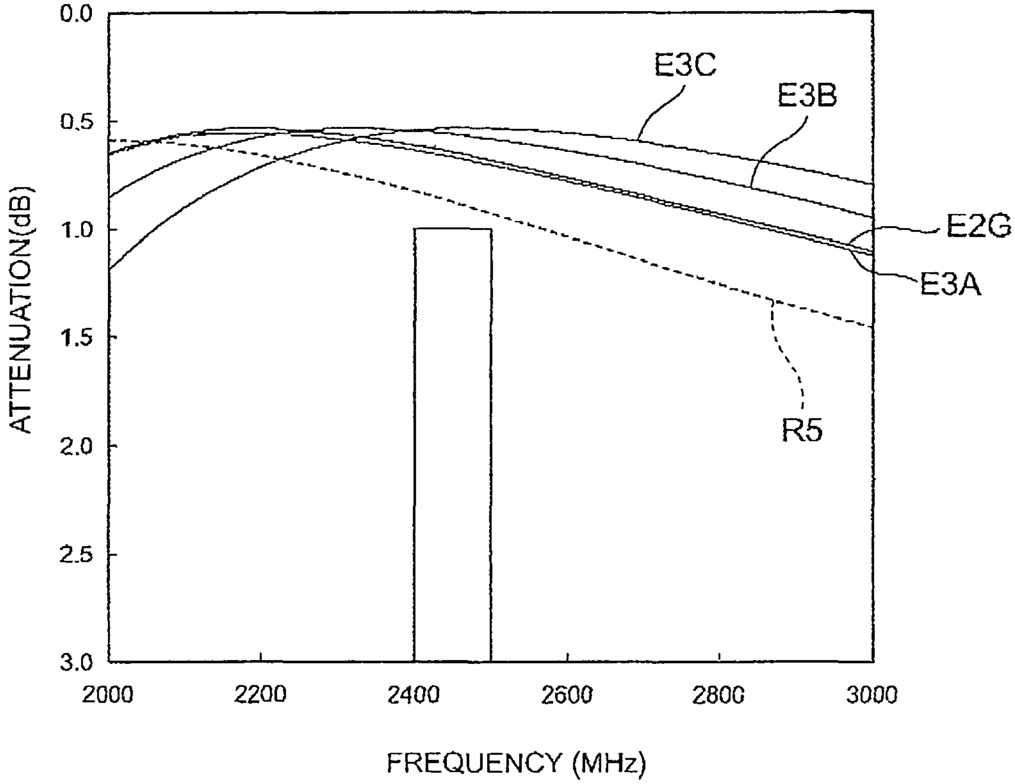
FIG. 22 is a graph showing the evaluation results of passage characteristic.
Figure 23:
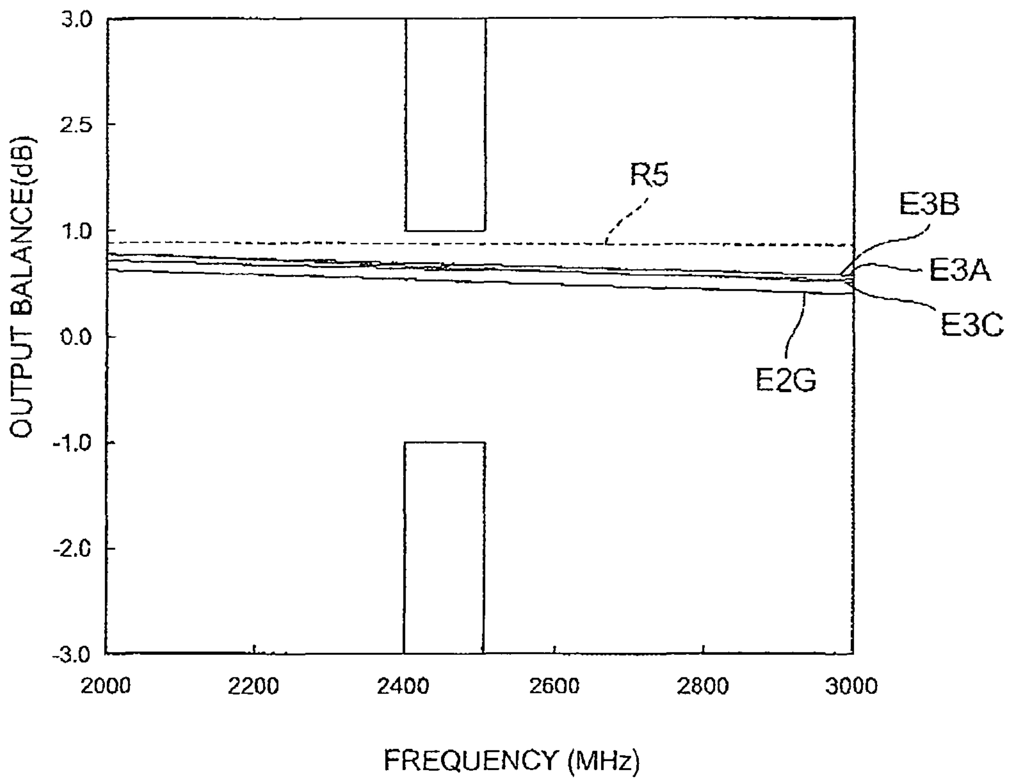
FIG. 23 is a graph showing the evaluation results of a balance characteristic.
Figure 24:
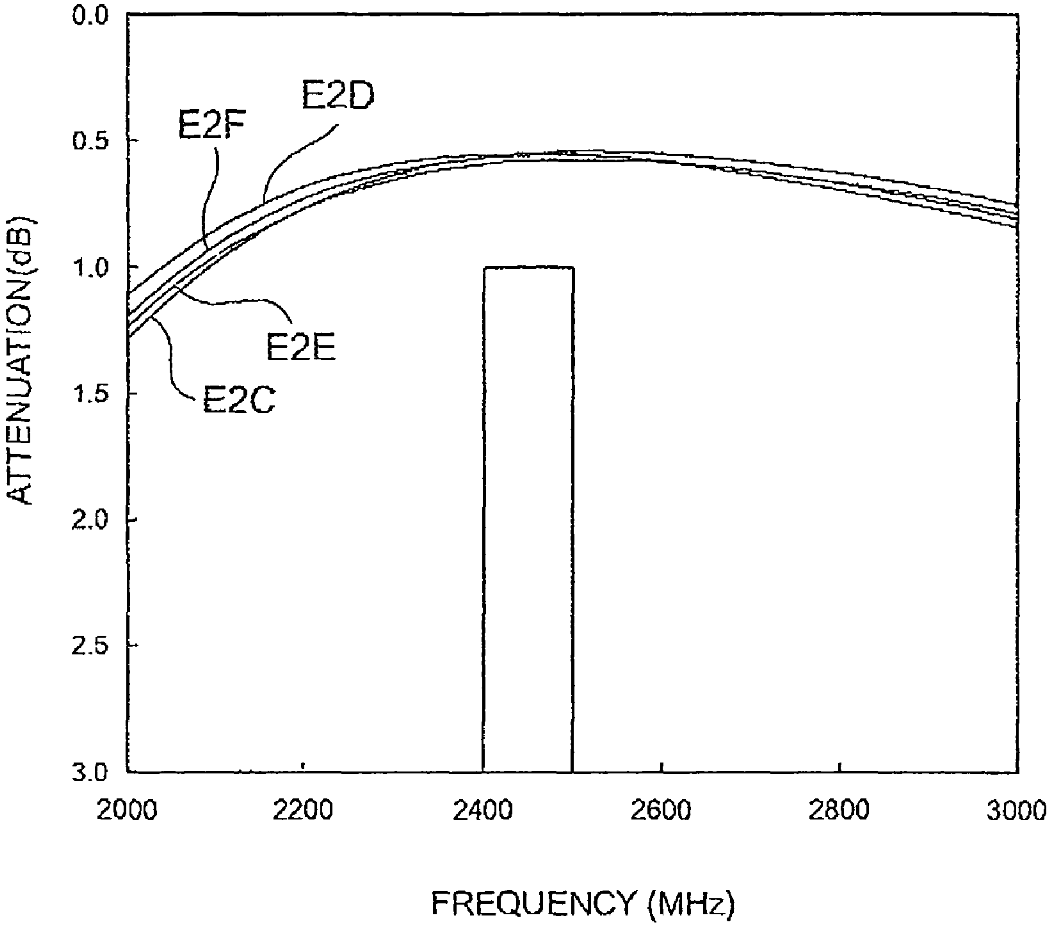
FIG. 24 is a graph showing the evaluation results of a passage characteristic.
Figure 25:
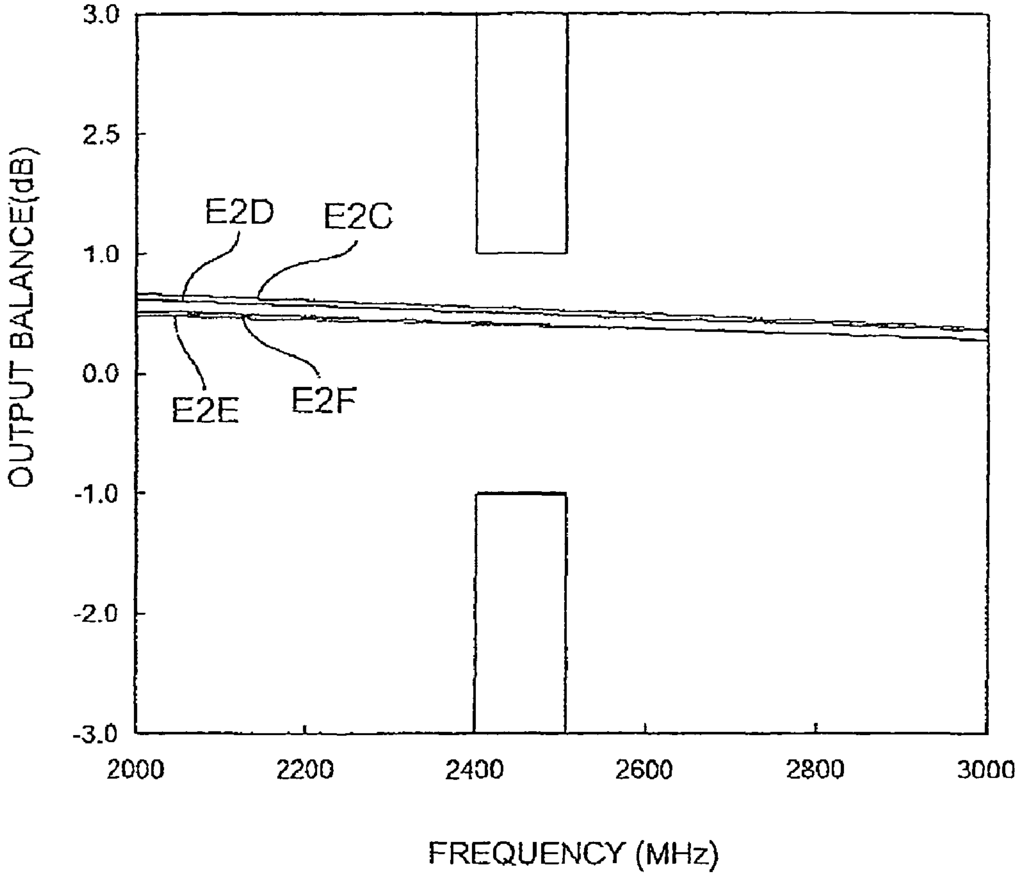
FIG. 25 is a graph showing the evaluation results of a balance characteristic.
Figure 26:
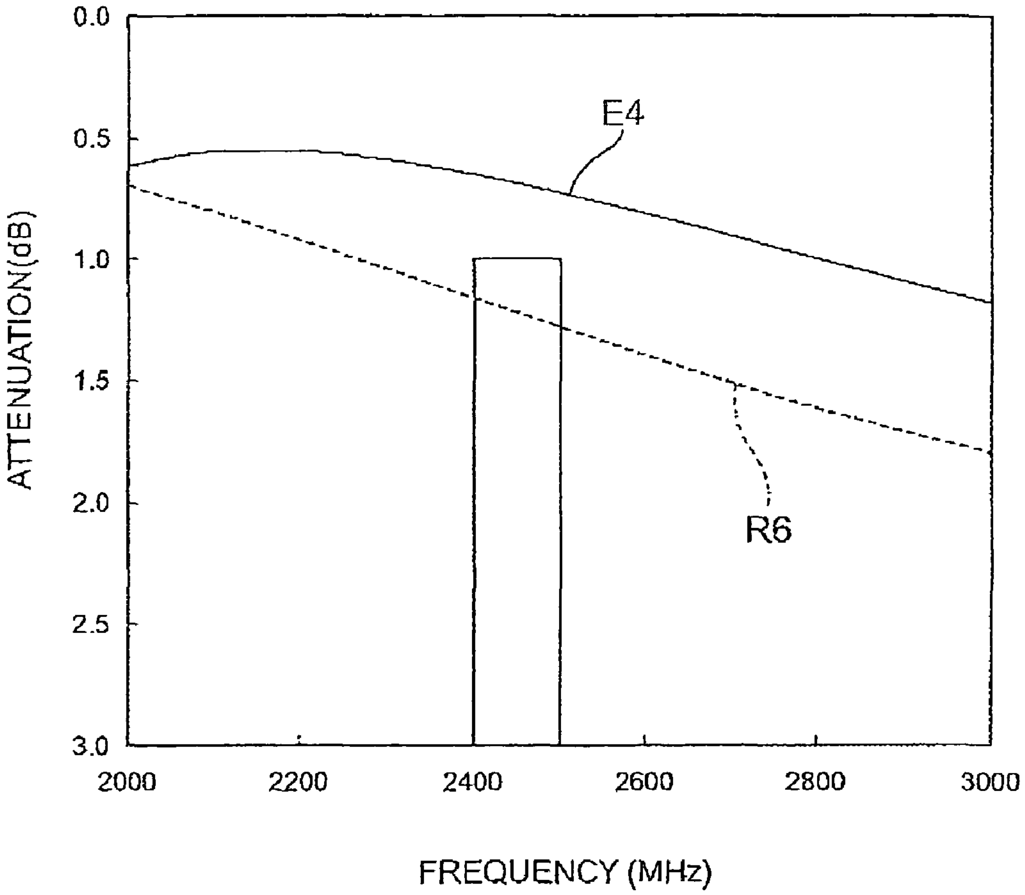
FIG. 26 is a graph showing the evaluation results of a passage characteristic.
Figure 27:
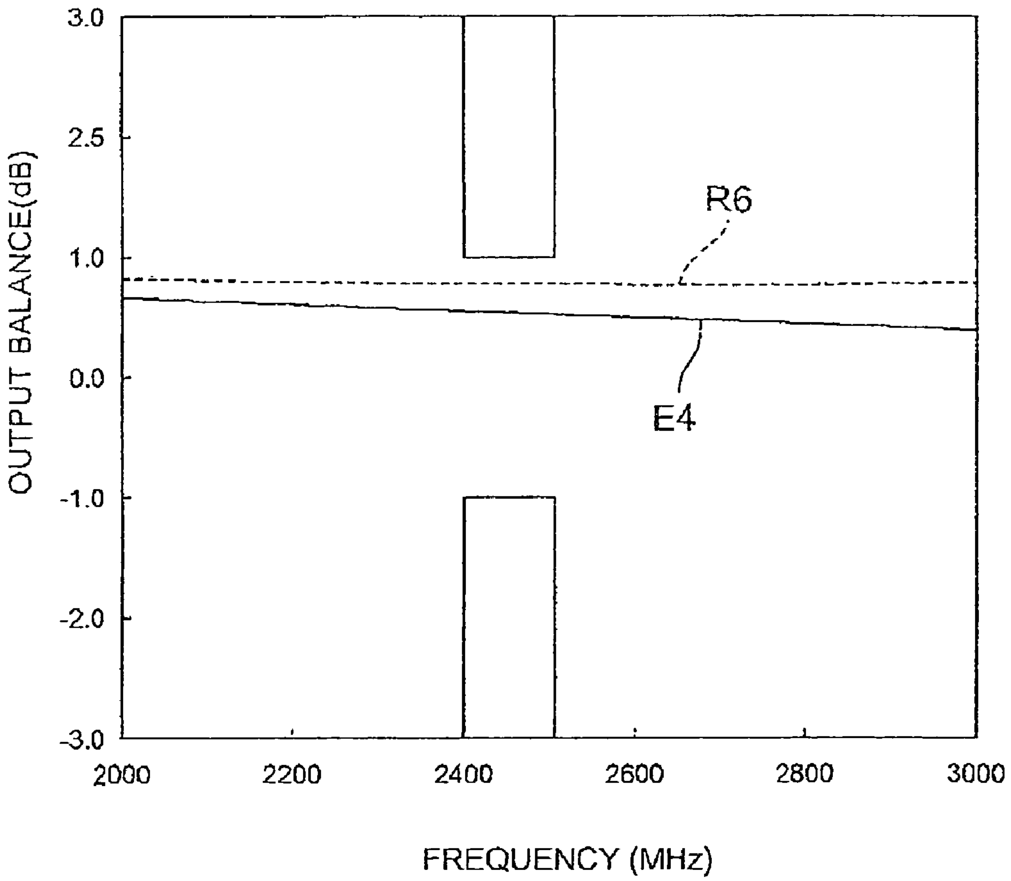
FIG. 27 is a graph showing the evaluation results of a balance characteristic.

On the other hand, it was found that, as shown in FIGS. 22 and 23, although the passage characteristic and balance characteristic of the thin film balun 5 of the comparative example satisfied the respective targeted specifications, the thin film baluns in each embodiment had a better passage characteristic and balance characteristic. Also, regarding the thin film balun 6 of the comparative example, it was found that, although the balance characteristic satisfied the targeted specification, attenuation in the passage characteristic was so large that it exceeded the targeted specification, as shown in FIG. 26.

Note that, as mentioned above, the present invention is not limited to the embodiments above, but various modifications may be made to the present invention without departing from the scope of the present invention. For example, the positions of the unbalanced terminal T0, the balanced terminals T1 and 12 and the ground terminal G are not limited to the positions shown in the figures. The multilayer wiring structure constituting the thin film balun may have more or fewer layers than shown. The layer structure may obviously be reversed so that the wiring layer B1 is configured as the uppermost layer while the wiring layer M3 is configured as the lowermost layer. Various coil arrangements may be employed without departing from the scope of the present invention.

In the thin film balun according to the present invention, at least a part of the C component (capacitor) connected to the ground terminal is contained in an area which is on the side of the second magnetic coupling with respect to the boundary between the first magnetic coupling area formed by the first line portion (first coil portion) and the third line portion (third coil portion) and the second magnetic coupling area formed by the second line portion (second coil portion) and the fourth line portion (fourth coil portion), thereby effectively preventing a resonant frequency from being increased to a high frequency due to size and thickness reductions of the thin film balun and maintaining a preferable passage characteristic, while improving the balance characteristics (in particular, the output balance). Accordingly, the present invention can be widely applied to wireless communication devices, apparatuses, modules and systems, which in particular require size and thickness reductions, as well as equipment provided therewith and production thereof.

The present application is based on Japanese priority application No. 2008-333087 filed on Dec. 26, 2008, the entire contents of which are hereby incorporated by reference.

What is claimed is:

1. A thin film balun comprising:

an unbalanced transmission line having a first line portion and a second line portion;

a balanced transmission line having a third line portion and a fourth line portion which are arranged so as to face the first line portion and the second line portion, respectively;

an unbalanced terminal connected to the first line portion;

a ground terminal connected to the second line portion via a C component;

a first balanced terminal connected to the third line portion; and a second balanced terminal connected to the fourth line portion, wherein:

the first line portion and the third line portion form a first magnetic coupling;

the second line portion and the fourth line portion form a second magnetic coupling; and at least a part or the entire of the C component overlaps with wiring of the second line portion and/or with wiring of the fourth line portion in a plan view.

2. A thin film balun comprising:

an unbalanced transmission line having a first coil portion and a second coil portion;

a balanced transmission line having a third coil portion and a fourth coil portion which are arranged so as to face the first coil portion and the second coil portion, respectively;

an unbalanced terminal connected to the first coil portion;

a ground terminal connected to the second coil portion via a C component;

a first balanced terminal connected to the third coil portion; and a second balanced terminal connected to the fourth coil portion, wherein:

the first coil portion and the third coil portion form a first magnetic coupling;

the second coil portion and the fourth coil portion form a second magnetic coupling; and at least a part or the entire of the C component overlaps with wiring of the second coil portion and/or with wiring of the fourth coil portion in a plan view.

3. The thin film balun according to claim 2, wherein the C component includes a capacitor having: a first electrode connected to the second coil portion; and a second electrode arranged so as to face the first electrode via a dielectric layer, the second electrode connected to the ground terminal.

4. The thin film balun according to claim 3 wherein at least a part or the entire of the capacitor overlaps with the wiring of the second coil portion and/or with the wiring of the fourth coil portion in the plan view.

* * * * *